(12) United States Patent
Park et al.

(10) Patent No.: US 6,456,122 B1
(45) Date of Patent: Sep. 24, 2002

(54) INPUT BUFFER CIRCUIT FOR TRANSFORMING PSEUDO DIFFERENTIAL SIGNALS INTO FULL DIFFERENTIAL SIGNALS

(75) Inventors: Joon-young Park, Daegu; Chang-sik Yoo, Suwon; Kee-wook Jung; Won-chan Kim, both of Seoul, all of (KR)

(73) Assignee: Samsung Electronics, Co., Ltd., Kyungki-do (KR)

(*) Notice: Subject to any disclaimer, the term of this patent is extended or adjusted under 35 U.S.C. 154(b) by 0 days.

(21) Appl. No.: 09/899,223

(22) Filed: Jul. 6, 2001

(30) Foreign Application Priority Data

Aug. 18, 2000 (KR) .......................................... 2000-47814

(51) Int. Cl.[7] .............................. G11C 7/06; H03K 5/22
(52) U.S. Cl. ................................. 327/55; 327/57; 327/77
(58) Field of Search .............................. 327/51–57, 63, 327/65, 77, 89, 560–563

(56) References Cited

U.S. PATENT DOCUMENTS 5,526,314 A * 6/1996 Kumar .......................... 327/57
5,625,308 A * 4/1997 Matsumoto et al. .......... 327/57
5,894,233 A * 4/1999 Yoon ............................ 327/55
6,147,514 A * 11/2000 Shiratake .................... 327/55

* cited by examiner

Primary Examiner—Toan Tran
(74) Attorney, Agent, or Firm—Lee & Sterba, P.C.

(57) ABSTRACT

An input buffer circuit for transforming pseudo differential input signals into full differential output signals wherein, the input buffer circuit includes a pull-up current source, two pull-down current sources, a differential input portion, and a positive feedback portion. The pull-up current source is formed of two PMOS transistors which are always in an "on" state, and provides an electric current. The two pull-down current sources are each formed of an NMOS transistor, which are always in an on state, and sink a pull-up electric current. The differential input portion is formed of two NMOS transistors, and receives an input signal and a reference signal, respectively. The positive feedback portion is formed of two NMOS transistors, and enlarges a voltage difference between two output terminals of the input circuit using positive feedback.

8 Claims, 2 Drawing Sheets

INPUT BUFFER CIRCUIT FOR TRANSFORMING PSEUDO DIFFERENTIAL SIGNALS INTO FULL DIFFERENTIAL SIGNALS

BACKGROUND OF THE INVENTION

1. Field of the Invention

The present invention relates to a semiconductor integrated circuit. More particularly, the present invention relates to an input buffer circuit employed for a memory or a data processing system.

2. Description of the Related Art

An input buffer circuit forms an input portion of a differential comparator, and the differential comparator has the functions of sampling a difference between two input signals during a specific clock period, and storing/transmitting the difference value. If the input buffer circuit of the differential comparator is used for a memory, the input signals are from a flash cell and a reference cell, and the output signals are fed to a differential input latch, which is a next stage. If the input buffer circuit is used in a data processing system where analog signals are transformed into digital signals, a difference between a signal which will be transformed, and a processed reference signal is read, and the result is available as an output.

FIG. 1 illustrates a circuit diagram of a circuit for sampling and holding a conventional pseudo differential input. Referring to FIG. 1, the conventional circuit includes an input buffer 110 for transmitting a pseudo differential input (Vin and Vref) to a flip-flop 120 which is a next stage; a flip-flop 120 for sampling and holding an output signal of the input buffer 110; and an output portion 130 that converts an output signal of the flip-flop 120 to a logic level.

The input buffer 110 includes a pull-up current source; 2 PMOS transistors (M1 and M2); a pull-down current source, an NMOS transistor (M5); and a differential input portion, NMOS transistors (M3 and M4).

The flip-flop 120 includes NMOS transistors (M10 and M11) for receiving the two output signals from the input buffer, PMOS transistors (M6 and M7) and NMOS transistors (M8 and M9) for sampling and holding signals fed into the two NMOS transistors (M10 and M11), an NMOS transistor (M12) for keeping sampling and holding in synchronization with a clock signal (Clk), and a switch (Sw) operated by an inverted clock signal (Clkb).

The output portion 130 includes two inverters (Inv1 and Inv2), PMOS transistors (M13, M14, M15 and M16) and NMOS transistors (M17, M18, M19 and M20) for enlarging a swing width of output signals (out and outb) as much as possible.

However, the conventional input buffer circuit 110 described in FIG. 1 has at least one significant disadvantage. Specifically, the difference between an input signal (Vin) and a reference signal (Vref) is not large, or if there are frequent changes during one period of a clock signal (Clk), output node voltages 11 and 12 of the input buffer circuit 110 may vary.

SUMMARY OF THE INVENTION

To solve the above problems, it is a feature of an embodiment of the present invention to provide an input buffer circuit which transforms pseudo differential input signals into full differential output signals.

Accordingly, to provide the above feature, there is provided an input buffer circuit including a pull-up current source for sourcing an electric current, two pull-down current sources for sinking the sourcing electric current, a differential input portion for receiving differential input signals, and a positive feedback portion for enlarging the differential output voltage.

The pull-up current source is formed of two PMOS transistors, the gates of which are connected to a low voltage power supply (Vss), so that an "on" state is always maintained and an electric current is provided to the differential input portion. It is preferable to make the size of the two transistors in the pull-up current source the same and provide the same amount of electric current to each of two output terminals.

The first pull-down current source and the second pull-down current source are each formed of one NMOS transistor. The gates of the first and second pull down current sources are connected to an external applied power source, a bias voltage, in order to sink an electric current from the pull-up current source in a saturation region. The first pull-down current source and the second pull-down current source sink an electric current flowing from the two PMOS transistors which form the pull-up current source.

The differential input portion is formed of two NMOS transistors, and receives an input signal (Vin) and a reference signal (Vref). An electric current corresponding to the voltage of the two received signals flows from the pull-up current source to the two output terminals of the input buffer circuit, and the amount of the electric current is indicated as a voltage of the respective output terminals.

The positive feedback portion is formed of two NMOS transistors, and when there is a voltage drop across the two output terminals of the input buffer circuit in response to the two input signals (Vin and Vref) applied to the differential input portion, a voltage drop between the two output terminals is enlarged using positive feedback.

These and other features of the present invention will be readily apparent to those of ordinary skill in the art upon review of the detailed description that follows.

BRIEF DESCRIPTION OF THE DRAWINGS

The above features and advantages of the present invention will become more apparent by describing in detail a preferred embodiment thereof with reference to the attached drawings in which.

DETAILED DESCRIPTION OF THE PREFERRED EMBODIMENTS

Figure 1:
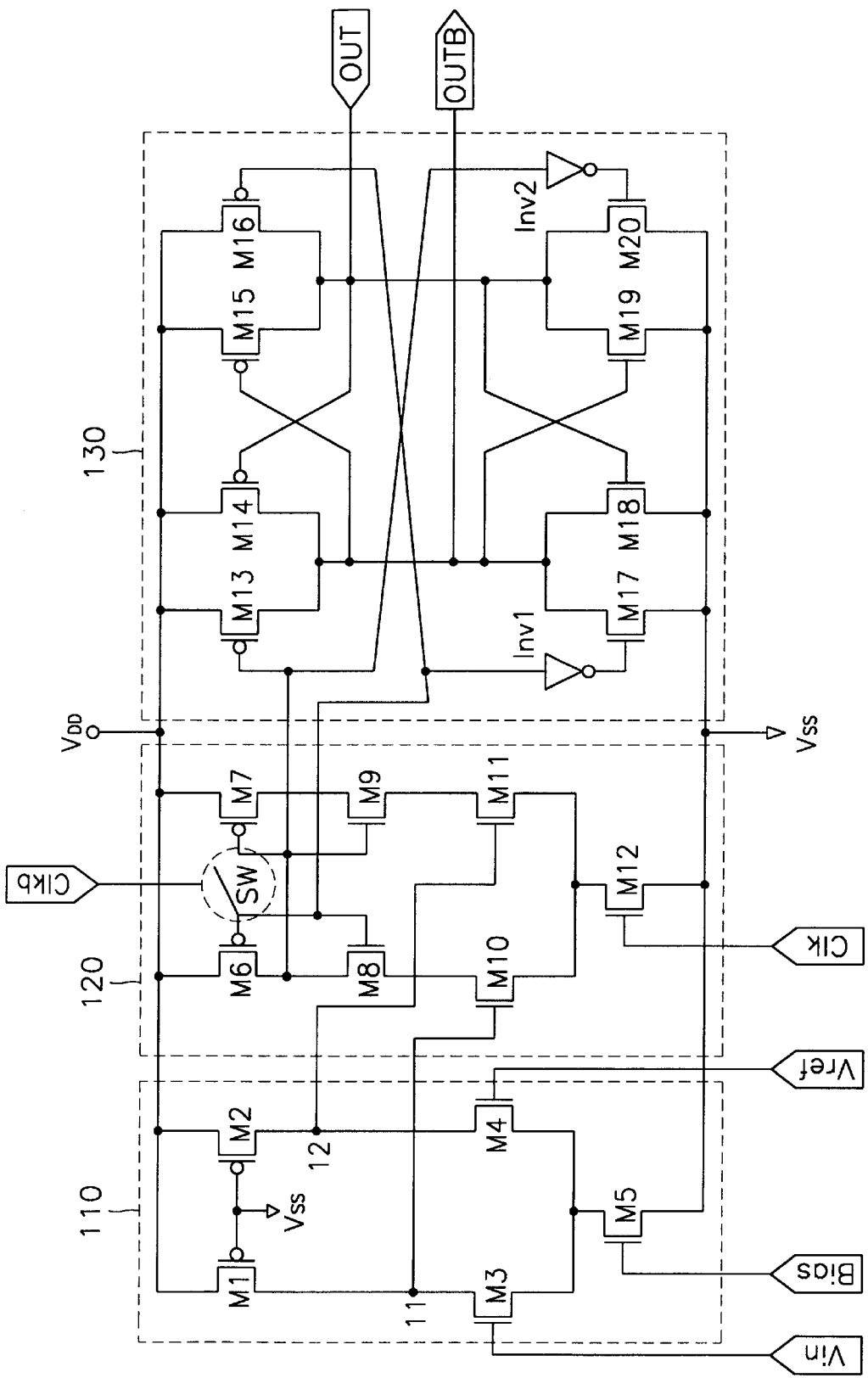
FIG. 1 illustrates a circuit diagram of a differential comparator with a built-in conventional input buffer circuit according to the prior art.

Korean Patent Application No. 00-47814, filed Aug. 18, 2000, and entitled: "Input Buffer Circuit for Transforming Pseudo Differential Signals into Full Differential Signals," is incorporated by reference herein in its entirety.

The present invention now will be described more fully with reference to the accompanying drawings, in which preferred embodiments of the present invention are shown. The same reference numerals in different drawings represent the same element, and thus their description will be omitted.

Figure 2:
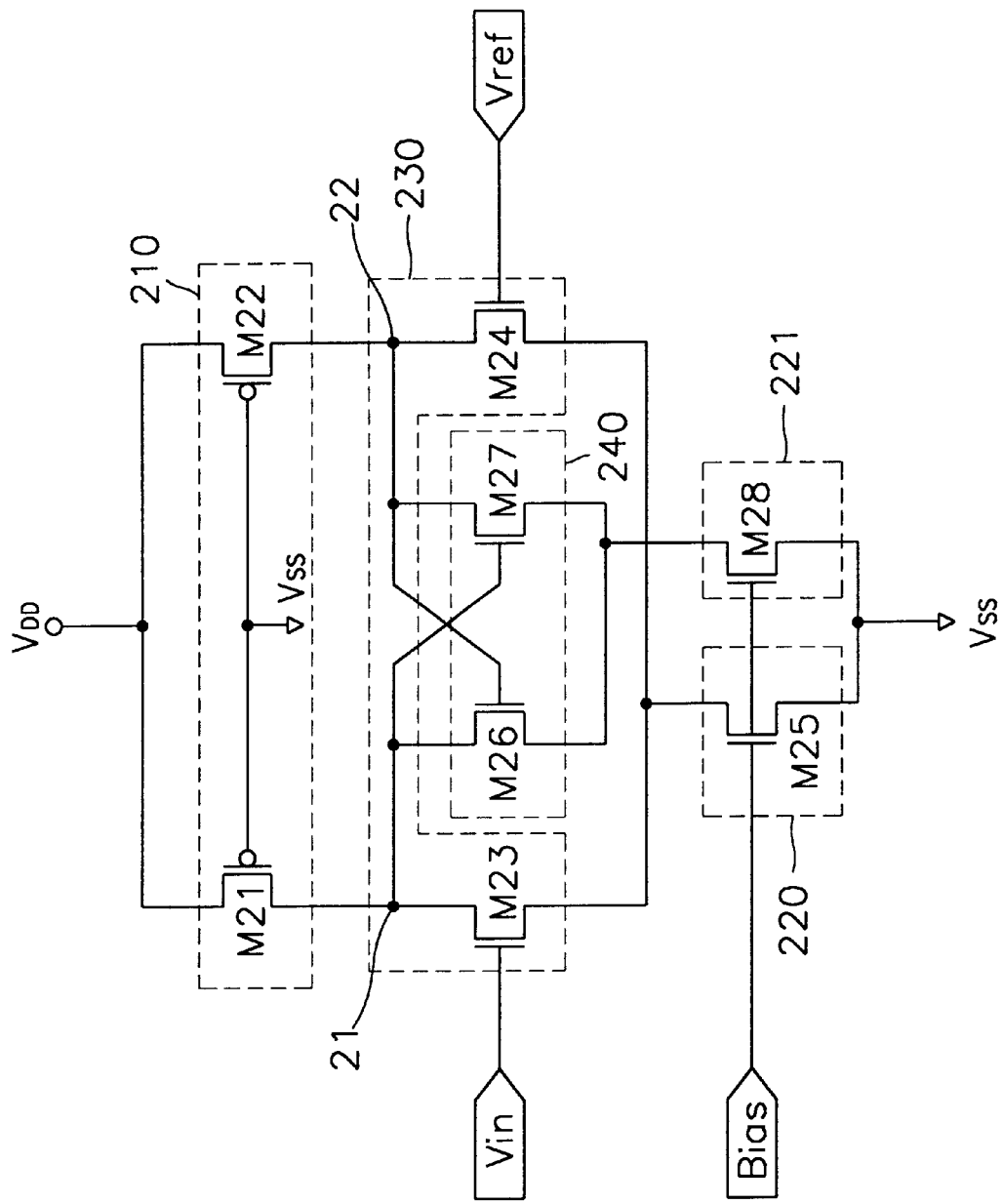
FIG. 2 illustrates a circuit diagram of an input buffer circuit according to a preferred embodiment of the present invention.

Referring to FIG. 2, an input buffer circuit according to an embodiment of the present invention includes a pull-up current source 210, two pull-down current sources 220 and 221, a differential input portion 230, and a positive feedback portion 240.

The pull-up current source 210 is formed of two PMOS transistors (M21 and M22), the gates of which are connected to a low voltage power supply (Vss), that is a ground voltage, so that an "on" state is always maintained for the pull-up current source. The pull-up current source 210 provides an electric current to the NMOS transistors (M23 and M24) of the differential input portion 230, and the NMOS transistors (M26 and M27) of the positive feedback portion 240. It is preferable to make the sizes of the two transistors (M21 and M22) the same, so as to provide the same amount of electric current to each of the two output terminals 21 and 22.

The first pull-down current source 220 and the second pull-down current source 221 are formed of NMOS transistors M25 and M28, respectively. Gates of the NMOS transistors M25 and M28 are all connected to an external applied voltage, a bias voltage, so that an electric current is sunk from the pull-up current source 210 in a saturation region. The first pull-down current source 220 and the second pull-down current source 221 sink an electric current flowing from the two PMOS transistors M21 and M22 which form the pull-up current source 210.

The differential input portion 230 is formed of two NMOS transistors (M23 and M24), and an input signal (Vin) is received at the gate of the NMOS transistor (M23), and a reference signal (Vref) is received at the gate of the NMOS transistor (M24). An electric current corresponding to the received two signals flows from the pull-up current source 210 to the two output nodes 21 and 22, and the amount of electric current is indicated as a voltage of the output nodes 21 and 22, respectively.

The positive feedback portion 240 is formed of two NMOS transistors (M26 and M27), and enlarges a voltage drop between the two output nodes 21 and 22 using positive feedback when there is a voltage drop across the two output nodes 21 and 22 in response to the two input signals (Vin and Vref) applied to the differential input portion 230.

Hereinafter, an input buffer circuit according to a preferred embodiment of the present invention will be described more fully with reference to FIG. 2. Here, it is assumed that the PMOS transistor (M21) and the PMOS transistor (M22) have the same size, the NMOS transistor (M25) and the NMOS transistor (M28) have the same size, the NMOS transistor (M23) and the NMOS transistor (M24) have the same size, and the NMOS transistor (M26) and the NMOS transistor (M27) have the same size.

If an input signal (Vin) is applied to the NMOS transistor (M23), and a reference signal (Vref) is applied to the other NMOS transistor (M24), an electric current flows in each of the output nodes 21 and 22, and voltage drop occurs in response to voltages of the two signals (Vin and Vref). Here, the output node voltages 21, 22 of FIG. 2 correspond to the output node voltages 11 and 12 of FIG. 1, respectively. The first output node voltage 21 provides positive feedback to the gate of the NMOS transistor (M27), and the second output node voltage 22 provides positive feedback, so that a difference between the voltage of the first output node 21 and the voltage of the second output node 22 becomes larger.

For example, if an input signal (Vin) which is relatively larger than a reference signal (Vref) is applied, an electric current flowing in the first output node 21 must be more than a current flowing in the second output node 22, so that the voltage at the first output node 21 is less than that at the second output node 22. Since the first output node 21 is connected to a gate of the NMOS transistor (M27), and the second output node 22 is connected to a gate of the NMOS transistor (M26), the NMOS transistor (M26) further lowers a voltage of the first output node 21, and on the contrary, the NMOS transistor (M27) still further raises the voltage of the second output node 22. The voltage difference between the two output terminals becomes larger due to positive feedback.

As described above, in the input buffer circuit according to an embodiment of the present invention, even though the voltage difference of two input signals is minute, the corresponding voltage difference between the two output nodes 21 and 22 of the input buffer circuit is large, so that a recognition error of the signals in the next step can be prevented.

As described above, the input buffer circuit according to an embodiment of the present invention has an advantage in that it can stabilize output signals by internally transforming the input signals into full differential signals even though the difference between voltages of the two input signals is minute.

While the present invention has been particularly described with reference to preferred embodiments thereof, it will be understood by those of ordinary skill in the art that various changes in form and details may be made therein without departing from the spirit and scope of the invention as defined by the appended claims.

What is claimed is:

1. An input buffer circuit comprising:
    a first output node;
    a second output node;
    a pull-up current source for sourcing an electric current to the first output node and the second output node;
    a first pull-down current source for sinking an electric current from the first output node and the second output node;
    a second pull-down current source for sinking an electric current from the first output node and the second output node;
    a differential input portion which is connected between the pull-up current source and the first pull-down current source, and receives two input signals, wherein the electric current from the pull-up current source to the first output node and the second output node are changed in response to a voltage difference of the two input signals; and
    a positive feedback portion which is connected between the pull-up current source and the second pull-down current source, and enlarges a voltage difference between the first output node and the second output node, when the voltage level of the two input signals are different from each other, wherein the positive feedback portion is consistantly connected to the first and the second output nodes by the sourcing operation of the pull-up current source and the sinking operation of the pull-down current sources.

2. The input buffer circuit of claim 1, wherein the positive feedback portion includes:
    a first MOS transistor of which a first end is connected to the first output node, a second end is connected to the second pull-down current source, and a gate is connected to the second output node; and
    a second MOS transistor of which a first end is connected to the second output node, a second end is connected to the second pull-down current source, and a gate is connected to the first output node.

3. The input buffer circuit of claim 1, wherein the second pull-down current source includes a third MOS transistor of which a first end is connected to the positive feedback portion, a second end is connected to the low power supply, and a gate is connected to an external applied bias.

4. The input buffer circuit of claim 1, wherein the pull-up current source includes:
   a first PMOS transistor having a gate connected to the low power supply and having a first end connected to the high power supply and a second end connected to the first output node; and
   a second PMOS transistor having a gate connected to the low power supply and having a first end connected to the high power supply and a second end connected to the second output node.

5. The input buffer circuit of claim 1, wherein the differential input circuit includes:
   a first NMOS transistor having a gate connected to an input signal Vin and having a first end connected to the first output node and a second end connected to the first pull-down current source; and
   a second NMOS transistor having a gate connected to the reference signal Vref and having a first end connected to the second output node and a second end connected to the first pull-down current source.

6. The input buffer circuit of claim 5, wherein the first pull-down current source includes a third NMOS transistor having a gate connected to an external applied bias and having a first end connected to the second ends of the first and second NMOS transistors and a second end connected to the low power supply.

7. The input buffer circuit of claim 6, wherein the positive feedback portion includes:
   a fourth NMOS transistor having a gate connected to the second output node and having a first end connected to the first output node and a second end connected to the second pull-down current source; and
   a fifth NMOS transistor having a gate connected to the first output node and having a first end connected to the second output node and a second end connected to the second pull-down current source.

8. The input buffer circuit of claim 7, wherein the second pull-down current source includes a sixth NMOS transistor having a gate connected to an external applied bias and having a first end connected to the second ends of the fourth and fifth NMOS transistors and a second end connected to the low power supply.

* * * * *